(12) United States Patent
Annapragada

(10) Patent No.: US 6,303,525 B1
(45) Date of Patent: Oct. 16, 2001

(54) METHOD AND STRUCTURE FOR ADHERING MSQ MATERIAL TO LINER OXIDE

(75) Inventor: Rao Venkateswara Annapragada, San Jose, CA (US)

(73) Assignee: Philips Electronics No. America Corp., New York, NY (US)

( * ) Notice: Subject to any disclaimer, the term of this patent is extended or adjusted under 35 U.S.C. 154(b) by 0 days.

(21) Appl. No.: 09/642,074

(22) Filed: Aug. 18, 2000

(51) Int. Cl.⁷ .................................................. H01L 21/469
(52) U.S. Cl. ........................ 438/782; 438/780; 438/781; 438/787
(58) Field of Search ................... 438/778, 780, 438/782, 781, 787

(56) References Cited

U.S. PATENT DOCUMENTS 5,616,202 * 4/1997 Camilletti et al. ................ 156/89
6,153,512 * 11/2000 Chang et al. ...................... 438/624
6,211,062 * 4/2001 Oda .................................... 438/623
6,232,237 * 5/2001 Tamaoka et al. .................. 438/725

FOREIGN PATENT DOCUMENTS

487857-A2 * 6/1992 (EP).
751238-A2 * 1/1997 (EP).
881678-A2 * 12/1998 (EP).

* cited by examiner

Primary Examiner—Trung Dang
(74) Attorney, Agent, or Firm—Peter Zawilski

(57) ABSTRACT

A method for depositing a liner dielectric on a semiconductor substrate provides for sufficient adhesion of low dielectric constant spin-on materials among metal layers in submicron processes. In an example embodiment, a method for adhering MSQ provides for a liner oxide on an aluminum alloy layer on a semiconductor substrate. First, the substrate is placed into a PECVD environment. A gas mixture of trimethylsilane and $N_2O$ is introduced into the PECVD environment at a trimethylsilane-to-$N_2O$ ratio of about 1:20 to 1:30. The gas mixture is reacted to deposit an oxide liner of a predetermined thickness. Adjusting the gas mixture trimethylsilane-to-$N_2O$ ratio to about 1:3 to 1:7 over the course of about 5 to 20 seconds, and sustaining the reaction thereof, deposits a methyl doped oxide.

15 Claims, 2 Drawing Sheets

METHOD AND STRUCTURE FOR ADHERING MSQ MATERIAL TO LINER OXIDE

FIELD OF INVENTION

The present invention is generally directed to the manufacture of a semiconductor device. In particular, the present invention relates to a process that provides for improving the adhesion of methyl silsesquioxane (MSQ) film to a liner oxide.

BACKGROUND OF INVENTION

As devices scale down to the sub-micron level, electrical characteristics such as capacitance that were negligible in devices having dimensions in multiples of microns, have become significant. For example, in a sub-0.20 μm process there has been a renewed interest in materials with a low dielectric constant (i.e., "low k").

A goal in processing sub-micron devices is to maintain a level of gate capacitance while minimizing the gate-to-source and gate-to-drain capacitance. As the oxide is made thinner the capacitance increases as shown in the relationship:

$$C_{ox} = \frac{\epsilon_o \epsilon_{SiO_2}}{t_{ox}} \cdot A,$$

where
A=area of gate
$\epsilon_{SiO_2}$=dielectric constant (or relative permittivity of $SiO_2$ taken as 3.9)
$t_{ox}$=oxide thickness The gate-to-drain capacitance is especially critical for transistor performance as it is amplified during switching due to the Miller effect. For example, in a series of logic stages, the equivalent capacitive loading to the previous logic stage is the gate-to-source capacitance multiplied by a factor of 1 plus the gain of the transistor. If the transistor has a gain of 100, the observed input capacitance would be 101 times the gate-to-drain capacitance. Consequently, it is desirable to not alter the parameters that tend to increase that capacitance. Therefore, using a dielectric material having a lower dielectric constant lowers the capacitance. It is advantageous to use lower k materials throughout the integrated circuit design where possible to minimize the parasitic capacitance.

The requirement for low k materials for sub-quarter micron and smaller devices has renewed the interest in spin-on dielectrics such as methyl silsesquioxane (MSQ) and hydrogen silsesquioxane (HSQ). MSQ has a dielectric constant of ~2.9. The empirical formula of MSQ is $CH_3SiO_{1.5}$. The addition of organic side groups to the basic O—Si—O backbone results in improved crack resistance of the films. The structure has a lower density and hence a lower dielectric constant than that of $SiO_2$.

In an example process, it is a challenge to integrate MSQ as a low k dielectric. MSQ and PECVD (plasma enhanced chemical vapor deposition) oxide do not adhere well to one another owing to the presence of methyl groups on the surface. The material has significant methyl content up to about 25%. The presence of methyl groups makes the film hydrophobic, as it is difficult to form SiOH bonds by breaking the Si—$CH_3$ bonds.

FIG. 1 depicts a substrate 100 having metal lines 110. The de-lamination of MSQ 130 from the liner oxide 120 may degrade performance of the device There exists a need to provide for the adhesion of MSQ to the PECVD oxide that resists de-lamination enabling the use of this low k dielectric to improve device yield and product performance.

SUMMARY OF INVENTION

The present invention is exemplified in a number of implementations, one of which is summarized below. It is a challenge to obtain sufficient adhesion of methyl silsesquioxane (MSQ) to aluminum alloys when MSQ is used as a gap-filling dielectric. Adhesion may be improved by using a liner dielectric that exhibits good adhesion to the aluminum on one hand, yet good adhesion to MSQ on the other. However, the MSQ layer may de-laminate if there is an abrupt interface between liner dielectric and the MSQ. A transition is made in the liner dielectric between silicon dioxide to a methyl-doped oxide, each film providing sufficient adhesion to aluminum alloy and MSQ, respectively.

A method for depositing a liner dielectric on a semiconductor substrate provides for sufficient adhesion of low dielectric constant spin-on materials. In an example embodiment, on a semiconductor substrate, there is a method of adhering a spin-on dielectric on a metal layer. A first-predetermined thickness of a liner dielectric is deposited on the metal layer. The liner dielectric has a chemical affinity to the metal layer. A transition layer of a second predetermined thickness is formed on the liner dielectric; the transition layer has less chemical affinity to the metal layer and increasing chemical affinity to the spin-on dielectric as the thickness of the transition layer increases. A third predetermined thickness of liner dielectric is deposited on the transition layer; the liner dielectric has a chemical affinity to the spin-on dielectric.

In another example embodiment, a method for adhering silsesquioxane compounds, provides a liner dielectric on an aluminum alloy metal layer on a semiconductor substrate, the method comprises placing the substrate in a CVD environment. A gas mixture comprising a precursor gas and $N_2O$ is introduced into the CVD environment. The ratio of precursor gas-to-$N_2O$ is predetermined. The gas mixture is reacted to deposit the liner dielectric of a predetermined thickness. An additional feature of this embodiment, is the during the reacting of the gas mixture, the precursor-to-$N_2O$ ratio may be adjusted so that silicon dioxide is deposited on the aluminum alloy metal layer a first predetermined thickness. By re-adjusting the precursor gas-to-$N_2O$ ratio, methyl doped oxide of a second predetermined thickness is deposited on the first predetermined thickness of the silicon dioxide. A further feature of this embodiment is wherein the re-adjusting of the precursor gas-to-$N_2O$ ratio produces a transition in the liner dielectric from a region of silicon dioxide to a region of methyl doped oxide.

The above summary of the present invention is not intended to represent each disclosed embodiment, or every aspect, of the present invention. Other aspects and example embodiments are provided in the figures and the detailed description that follows.

BRIEF DESCRIPTION OF THE DRAWINGS

The invention may be more completely understood in consideration of the following detailed description of various embodiments of the invention in connection with the accompanying drawings, in which.

Figure 1:
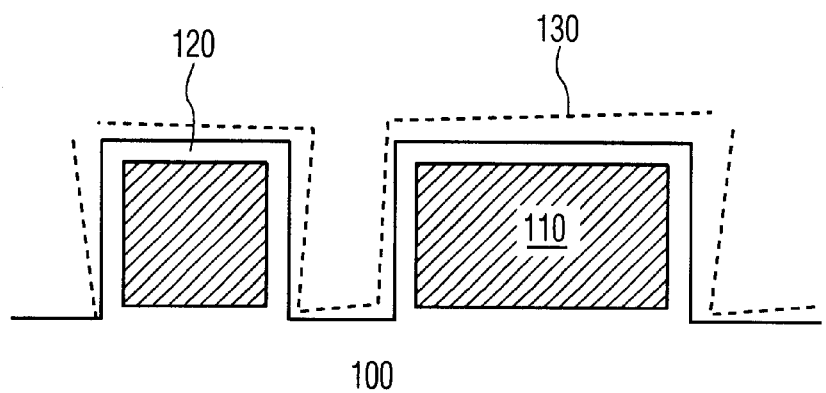
FIG. 1 is a cross-section of a device structure depicting MSQ delaminating from the liner oxide.

While the invention is susceptible to various modifications and alternative forms, specific embodiments thereof have been shown by way of example in the drawings and will herein be described in detail.

DETAILED DESCRIPTION

The present invention has been found to be useful and advantageous in connection with providing more reliable adhesion between the liner oxide and methyl silsesquioxane (MSQ) spin-on material. In the discussion that follows, a MOS structure is used to describe an example implementation of the invention. However, the invention is not so limited.

In an example process according to the present invention, after deposition of the liner oxide on a semiconductor substrate, a transition layer is formed thereon. The transition layer provides a bridge between the MSQ and liner oxide. On one side of the transition layer in contact with the liner oxide, its physical and chemical properties are similar to that of the liner oxide. On the other side of the transition layer in contact with MSQ, the transition layer chemical and physical properties are similar to that of MSQ. In that the properties in the transition layer are matched at the MSQ/transition layer interface and the liner oxide/transition layer interface, there is no abrupt interface that may de-laminate during subsequent processing due to a mismatch of properties between the interfaces. FIGS. 2A–2D depict a series of steps involved in improving the adhesion of MSQ to a liner oxide.

Figure 2A:
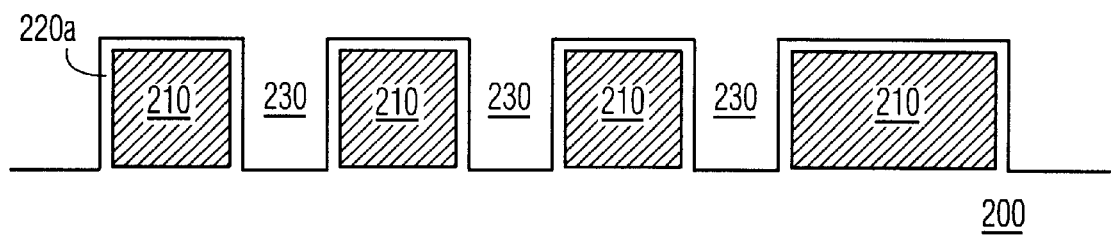
FIG. 2A is a cross-section of a device structure at deposition of liner oxide.

Refer to FIG. 2A, a semiconductor substrate 200 is at the metallization stages of fabrication, underlying components such as transistors, resistors (not illustrated) are connected to one another through with metal lines 210. Per design rule requirements of a given process, metal lines 210 are spaced apart at least a minimum distance from each other. The spaces 230 between the metal lines are typically filled with a dielectric. As the device dimensions decrease there is a need to minimize the capacitance and use a low k dielectric such as MSQ or HSQ.

In an example embodiment according to the present invention, prior to applying the spin-on dielectric, the semiconductor substrate is placed into a plasma-enhanced chemical vapor deposition chamber (PECVD) chamber. The transitional liner oxide may be made using trimethylsilane or tetramethylsilane as precursors for forming the methyl doped oxide film. Whether oxide or a methyl-doped oxide is deposited on the substrate is determined by the trimethylsilane to $N_2O$ ratio. At a high $N_2O$ flow, a silicon dioxide layer 220a forms and deposited onto the aluminum metal at a thickness of about 250 Å. Silicon dioxide adheres well to the aluminum metal lines.

Depending upon the chemistry of the deposition process, the ratio of silicon-to-oxygen may vary. For example, the process may form "silicon-rich" oxide, SiO. To include the variations in stoichiometry, t is appropriate to depict the formula as $Si_xO_y$.

Figure 2B:
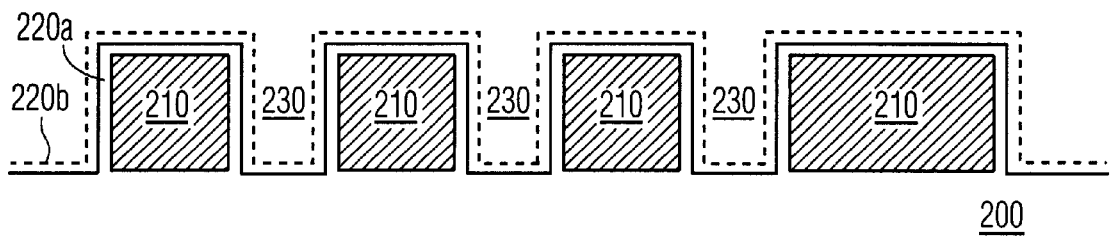
FIG. 2B is FIG. 2A after a transitional layer of methyl doped oxide is formed on the liner oxide in an embodiment according to the present invention.

Refer to FIG. 2B. Later in the deposition, the $N_2O$ is gradually decreased to form about 250 Å of methyl doped oxide 220b in the liner. The transition between silicon dioxide 220a and the methyl-doped oxide 220b is gradual. After the deposition the substrate is removed from the chamber.

In another example process, the silicon dioxide layer 220a may be formed in a separate chamber and the methyl-doped oxide 220b may be formed in another.

Figure 2C:
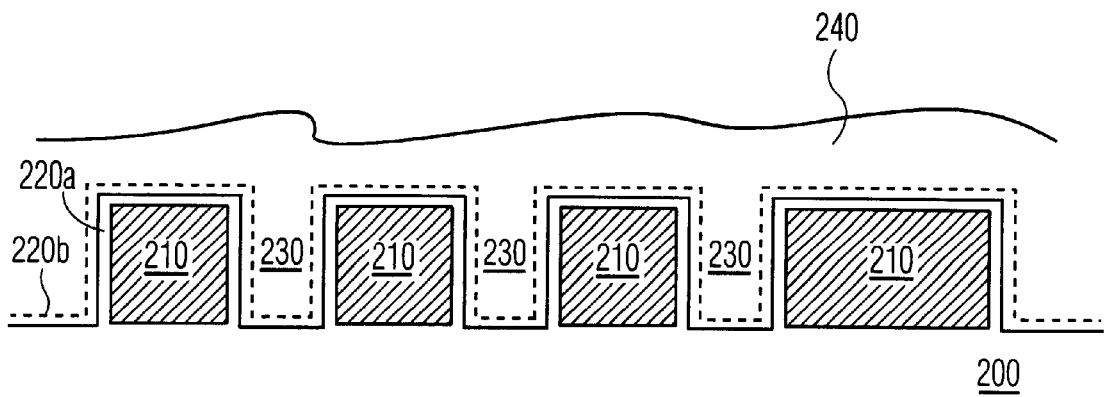
FIG. 2C depicts FIG. 2B after deposition of MSQ.
Figure 2D:
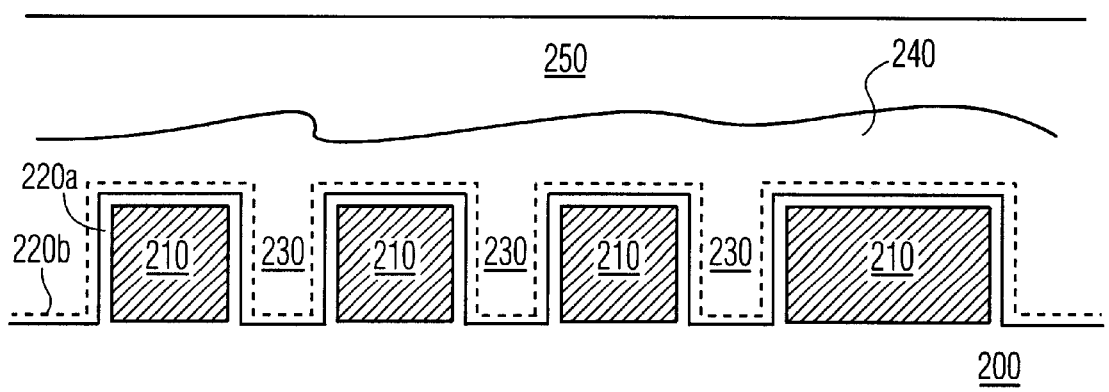
FIG. 2D depicts FIG. 2C after cap oxide.

Having deposited a transitional liner oxide of oxide 220a and methyl doped oxide 220b, the spin-on MSQ or HSQ may be applied. Refer to FIG. 2C. The MSQ layer 240 fills in the spaces 230 between metal lines 210. Refer to FIG. 2D. Upon the MSQ layer 240 a cap oxide layer 250 is applied. Depending upon specific process requirements, the cap oxide layer 240 is planarized so that the device may be further processed. If another metal layer is used in the device design, the aforementioned process may be repeated so that low k dielectric may be applied between the metal lines.

In an example process according to the present invention, the PECVD chamber may be of a number of manufacturers such as Applied Materials or Novellus. At a temperature of about 150° C. to about 400° C., at a pressure of about 2 to 10 Torr, with RF power in the range of about 50 Watts to 250 Watts, the $SiO_2$ is deposited on the metal. The $SiO_2$ is made from one of the precursor gases, trimethylsilane, $SiH(CH_3)_3$ or tetramethylsilane, $Si(CH_3)_4$ combined with $N_2O$ at a ratio of about 1:20 to about 1:30. The flow rates are about 10 sccm to 60 sccm for precursor gas and about 200 sccm to about 1800 sccm. After about 100 Å to about 1000 Å of liner oxide is deposited the gas mixtures are transitioned over the course of about 3 to 25 seconds.

After the transition, methyl doped oxide is deposited. The precursor gas, trimethylsilane, $SiH(CH_3)_3$ or tetramethylsilane, $Si(CH_3)_4$ and $N_2O$ are at a ratio of about 1:3 to about 1:7. Flow rates for the precursor gas and $N_2O$ range from about 10 sccm to about 60 sccm and 30 sccm to about 360 sccm, respectively.

While the present invention has been described with reference to several particular example embodiments, those skilled in the art will recognize that many changes may be made thereto without departing from the spirit and scope of the present invention, which is set forth in the following claims.

What is claimed:

1. On a semiconductor substrate, a method of adhering a spin-on dielectric on a metal layer comprising:

depositing a first predetermined thickness of a liner dielectric on the metal layer, the liner dielectric having a chemical affinity to the metal layer;

forming a transition layer of a second predetermined thickness on the liner dielectric, the transition layer having less chemical affinity to the metal layer and increasing chemical affinity to the spin-on dielectric as the thickness of the transition layer increases; and depositing a third predetermined thickness of liner dielectric on the transition layer, the liner dielectric having a chemical affinity to the spin-on dielectric.

2. The method of claim 1 wherein the spin-on dielectric includes at least one of the following: methyl silsesquioxane, hydrogen silsesquioxane.

3. The method of claim 2 wherein the first predetermined thickness of liner dielectric includes silicon dioxide, silicon-rich oxide, and $Si_xO_y$.

4. The method of claim 3 wherein the transition layer comprises a region of silicon dioxide transitioning to a region of methyl doped oxide.

5. The method of claim 1 wherein, the liner dielectric is deposited by one of the following: chemical vapor deposition (CVD) and plasma-enhanced chemical vapor deposition (PECVD); and wherein, the transition layer is formed by one of the following: chemical vapor deposition (CVD) and plasma-enhanced chemical vapor deposition (PECVD).

6. The method of claim 5 wherein the transition layer comprises a methyl doped oxide film formed in a PECVD environment using precursor gases selected from at least one of the following: trimethylsilane, tetramethylsilane.

7. The method of claim 6 wherein the precursor gas is blended with nitrogen oxide ($N_2O$) in a predetermined ratio to yield silicon dioxide transitioning to methyl doped oxide.

8. The method of claim 7 wherein the transition layer is deposited with a thickness in the range of about 100 Å to 2000 Å; and wherein, the $SiO_2$ thickness is in the range of about 50 Å to about 100 Å; and wherein the methyl doped oxide thickness is in the range of about 50 Å to about 1000 Å.

9. A method for adhering a silsesquioxane compound, providing a liner dielectric on an aluminum alloy metal layer on a semiconductor substrate, the method comprising:

placing the substrate in a CVD environment;

introducing a gas mixture into the CVD environment, wherein the gas mixture comprises a precursor gas and $N_2O$ at a defined precursor gas-to-$N_2O$ ratio; and reacting the gas mixture to deposit the liner dielectric of a predetermined thickness.

10. The method of claim 9 wherein reacting the gas mixture comprises, adjusting the precursor gas-to-$N_2O$ ratio so that silicon dioxide is deposited on the aluminum alloy metal layer at a first predetermined thickness; and re-adjusting the precursor gas-to-$N_2O$ ratio so that methyl doped oxide is deposited on the silicon dioxide at a second predetermined thickness.

11. The method of claim 10 wherein the re-adjusting the precursor gas-to-$N_2O$ ratio transitions the liner dielectric from a region of silicon dioxide to a region of methyl doped oxide.

12. The method of claim 9 wherein the precursor gas includes at least one of the following: trimethylsilane, tetramethylsilane.

13. A method for adhering a silsesquioxane compound providing a liner oxide on an aluminum alloy metal layer on a semiconductor substrate, the method comprising:

placing the substrate in a PECVD environment;

introducing a gas mixture into the PECVD environment, wherein the gas mixture comprises a precursor gas and $N_2O$ at a precursor gas-to-$N_2O$ first ratio of about 1:20 to 1:30;

reacting the gas mixture to deposit an oxide liner of a thickness in the range of about 100 Å to 1000 Å; and adjusting the gas mixture and sustaining the reaction thereof of the precursor gas and $N_2O$ at a precursor gas-to-$N_2O$ second ratio of about 1:3 to about 1:7 to deposit a methyl doped oxide liner of a thickness in the range of about 100 Å to 1000 Å.

14. The method of claim 13 wherein the adjusting of the gas mixture from the first precursor gas-to-$N_2O$ ratio to the second precursor gas-to-$N_2O$ ratio takes about 3 to 30 seconds.

15. The method of claim 13 wherein the precursor gas includes at least one of the following: trimethylsilane, tetramethylsilane.

\* \* \* \* \*